United States Patent [19]

Deguchi et al.

[11] Patent Number: 4,760,556
[45] Date of Patent: Jul. 26, 1988

[54] NONVOLATILE SEMICONDUCTOR MEMORY DEVICE

[75] Inventors: Mikio Deguchi; Kazuyasu Fujishima; Yasushi Terada, all of Itami, Japan

[73] Assignee: Mitsubishi Denki Kabushiki Kaisha, Tokyo, Japan

[21] Appl. No.: 911,431

[22] Filed: Sep. 25, 1986

[30] Foreign Application Priority Data

Sep. 25, 1985 [JP] Japan .................................. 60-213781

[51] Int. Cl.$^4$ ............................................ G11C 11/40
[52] U.S. Cl. ................................... 365/149; 365/185; 365/228
[58] Field of Search ............... 365/149, 150, 182, 184, 365/185, 189, 228

[56] References Cited

PUBLICATIONS

"A 5V-Only 4K Nonvolatile Static RAM", Neil J. Becker et al, ISSCC Digest of Technical Papers, pp. 170-171, Feb. 1983.

*Primary Examiner*—Joseph A. Popek
*Attorney, Agent, or Firm*—Lowe, Price, Leblanc, Becker & Shur

[57] ABSTRACT

Each of the memory cells forming a nonvolatile RAM comprises one floating-gate transistor and one capacitor. When the power source is turned on, storage of information is performed according to the amount of electric charge stored in each capacitor. When the power source is turned off, nonvolatile storage of information is performed according to the level of the threshold voltage of each floating-gate transistor.

7 Claims, 3 Drawing Sheets

NONVOLATILE SEMICONDUCTOR MEMORY DEVICE

BACKGROUND OF THE INVENTION

1. Field of the Invention

The present invention relates to a nonvolatile semiconductor memory device and particularly to a nonvolatile memory device capable of performing reading and writing operation at random (referred to hereinafter as a nonvolatile RAM).

2. Description of the Prior Art

In the prior art, an EEPROM is known as an electrically reloadable nonvolatile semiconductor memory device. However, an reprogrammable involves disadvantages that writing operation takes time represented by milliseconds and that the number of reloading operations is limited. For this reason, a conventional nonvolatile RAM is formed by combination of a static RAM cell for high speed reading and writing operation and an EEPROM cell for nonvolatile storage.

FIG. 1 shows an example of an arrangement of the memory cell in a conventional nonvolatile RAM. This memory cell in FIG. 1 is disclosed in ISSCC Digest of Tech. Papers, pp. 170–171, Feb., 1983. Referring to FIG. 1, the memory cell comprises two portions; one is a memory cell portion 1 as a static RAM comprising flip-flop formed by four MOS transistors Q1–Q4, and two transfer gates Q5 and Q6, and the other is a memory cell portion 2 as an EEPROM comprising a floating gate tunnel oxide (FLOTOX) double gate transistor Q7 and two transistors Q8 and Q9. The output end (the drain of the transistor Q2) of the flip-flop is connected to the FLOTOX transistor Q7 through the transfer gate Q8 so that the function of the nonvolatile RAM is performed by transference of the stored content between the two portions 1 and 2. Selection of the memory cell is made by means of a word line WL. More specifically, selection of the word line WL enables the transfer gates Q5 and Q6 to be opened so that data is read out or written through bit lines BL and $\overline{BL}$. Nonvolatile storage of data is made by applying appropriate voltage signals to the terminals CLR, PRO and CLK and the power supply line $V_{DD}$ of the memory cell through the transfer gate Q8 and the transistor Q9.

Thus, the memory cell of the conventional nonvolatile RAM is formed by combination of the memory cell portion as the static RAM and the memory cell portion as the EEPROM and accordingly there are disadvantages that the number of transistors necessary for one memory cell becomes large and the area occupied by one cell is increased, which makes it difficult to improve the integration scale. In addition, the number of signal lines becomes large, which causes the circuit configuration and the operation to be complicated.

SUMMARY OF THE INVENTION

An object of the present invention is to provide a nonvolatile semiconductor memory device by which the number of transistors for one memory cell, as well as the area for one cell can be decreased and the operation can be simplified.

Briefly stated, the present invention is a nonvolatile semiconductor memory device which comprises memory cells each comprising one variable threshold voltage transistor and one capacitor and this nonvolatile semiconductor memory device operates in a manner in which storage of data is made according to the amount of electric charge stored in the capacitor when the power source is turned on and nonvolatile storage of data is made according to the level of the threshold voltage of the variable threshold voltage transistor when the power source is turned off.

Since a memory cell is formed by one variable threshold voltage transistor and one capacitor in the present invention, it is made possible to realize a nonvolatile semiconductor memory device having an extremely simplified circuit configuration and a small area for each cell, which is suited for large-scale integration. In addition, the operation of the above stated nonvolatile semiconductor memory device can be performed in a simplified manner.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
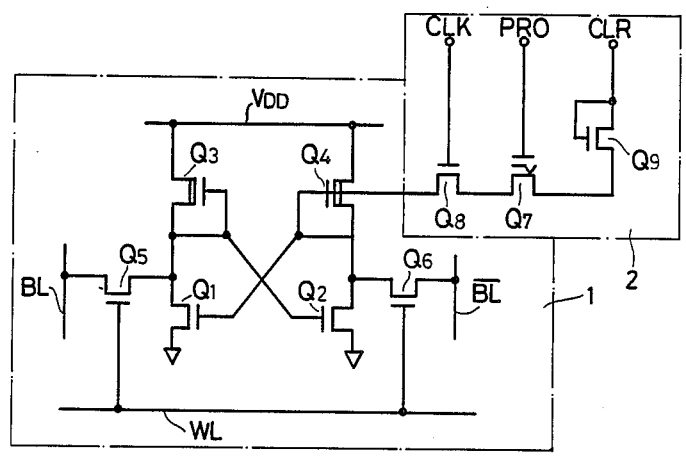
FIG. 1 is a circuit diagram showing an example of a memory cell in a conventional nonvolatile RAM.
Figure 2:
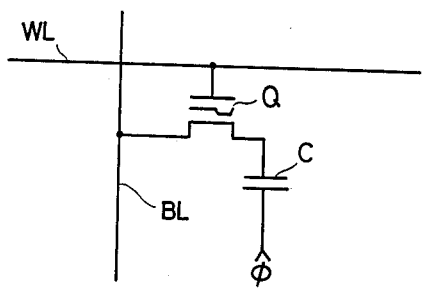
FIG. 2 is a circuit diagram showing a memory cell in a nonvolatile semiconductor memory device of an embodiment of the present invention.
Figure 4:
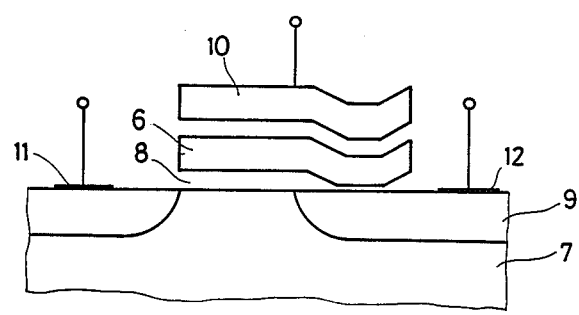
FIG. 4 shows a sectional structure of a floating gate transistor used in an embodiment of the present invention.

FIG. 2 is a circuit diagram showing a memory cell in a nonvolatile semiconductor memory device of an embodiment of the present invention. Referring to FIG. 2, a transistor Q serves to perform nonvolatile storage and it has a function of storing and maintaining electric charge. A transistor whose threshold voltage changes according to the amount of stored electric charge is used as the transistor Q. In this embodiment, a floating-gate transistor is used as the transistor Q. The control gate (indicated by the reference numeral 10 in FIG. 4) of this transistor is connected to a word line WL; the source (indicated by the reference numeral 11 in FIG. 4) is connected to a bit line BL; and the drain (indicated by the reference numeral 12 in FIG. 4) thereof is connected to an electrode of a capacitor C. As shown in FIG. 4, the floating gate transistor Q is for example a transistor (a FLOTOX transistor) in which an oxide film 8 interposed between a floating gate 6 and a semiconductor substrate 7 is partially made thinner in a portion extending on a drain diffusion region 9 than the other portion. A clock $\phi$ is applied to the other electrode of the capacitor C so that the floating-gate transistor Q performs nonvolatile storage.

Figure 3:
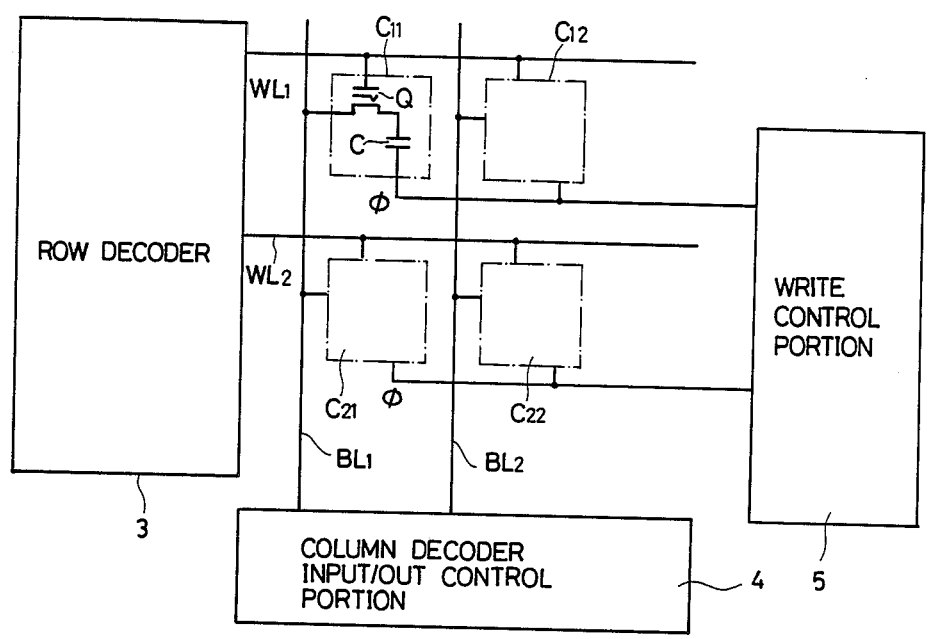
FIG. 3 is a block diagram showing an example of an arrangement of a nonvolatile RAM using the memory cell as shown FIG. 1.

FIG. 3 is a block diagram showing an example of an arrangement of a nonvolatile RAM using memory cells as shown in FIG. 2. Each of the memory cells C11, C12, C21, C22 etc. is formed as shown in FIG. 2. The memory cells C11, C12, C21, C22 etc. are arrayed in a matrix along the word lines WL1, WL2 etc. extending from a row decoder 3 and along the bit lines BL1, BL2 etc. extending from a column decoder 4. Clocks $\phi$ from a write control portion 5 are applied to the respective memory cells C11, C12, C21, C22 etc. The write control portion 5 may be adapted to provide clocks φ in response to an external signal or may be adapted to comprise a circuit for detecting the turning off of the power source and provide clocks φ automatically before the power source is entirely turned off.

The operation of the embodiment shown in FIG. 3 will be described in the following. At the time of normal reading and writing operation (when the power source is turned on), the memory cells C11, C12, C21, C22 etc. function as a dynamic RAM of one-transistor one-capacitor type formed by a floating-gate transistor Q as a transfer gate and a capacitor C. Thus, data is stored according to existence or nonexistence of electric charge in each capacitor C. Selection of a memory cell is made by selection of a word line and a bit line specified by the row decoder 3 and the column decoder 4.

Nonvolatile storage of data (when the power source is turned off) is performed in the following manner. Clocks φ from the write control portion 5 are applied to the respective cells C11, C12, C21, C22 etc. before the power source is entirely turned off, and the voltage in the drain of each floating-gate transistor Q is made to rise to a high level by capacitance coupling so that the electric charge is injected to each floating- gate. The amount of electric charge to be injected to each floating-gate changes according to the voltage applied to the drain of each floating-gate transistor Q. And this voltage varies according to the magnitude of the stored data, namely, the amount of electric charge stored in each capacitor C when the power source is turned on. Consequently, the stored information when the power source is turned on is stored in a nonvolatile manner as the level of the threshold voltage of each floating-gate transistor Q. In this case, as the positive voltage applied to the respective drains increases, the tunnel current flowing into the respective floating-gates through the respective thin oxide films from the respective drains becomes large and the threshold voltage of the respective floating-gate transistors Q is lowered. In order to reproduce the data stored in a nonvolatile manner, a voltage is applied to the word lines WL1, WL2, etc. to cause only the floating-gate transistors having a low threshold voltage to be turned on and the floating-gate transistors having a high threshold voltage to be turned off and at the same time the capacitors C of the respective memory cells are recharged through the bit lines BL1, BL2 etc. Thus, the nonvolatile RAM performs nonvolatile storage.

Although the above described embodiment uses FLOTOX type floating gate transistors as the variable threshold voltage transistors, transistors of other types (for example, MNOS transistors) may be used as the variable threshold voltage transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device including a plurality of memory cells and functioning as a random access memory when a power source connected thereto is turned on and functioning as a nonvolatile memory when said power source is turned off,
    each of said memory cells comprising
        one variable threshold voltage transistor having a function of storing and maintaining electric charge, the threshold voltage being changed according to the amount of the stored electric charge, and
        one capacitor,
    said nonvolatile semiconductor memory device comprising
    first drive means for driving each of said memory cell so that said capacitor of each said memory cell stores data according to the amount of the stored electric charge when said power source is turned on, and
    second drive means for driving each said memory cell so that said variable threshold voltage transistor of each said memory cell stores data in a nonvolatile manner according to the level of said threshold voltage when said power source is turned off,
    said first drive means comprises
        a row decoder,
        a plurality of word lines extending from said row decoder,
        a column decoder, and
        a plurality of bit lines extending from said column decoder,
    said second drive means comprises
        control signal providing means for providing a control signal to make each of said memory cells perform nonvolatile storage, and
        a plurality of control signal lines for transmitting said control signal to each of said memory cells,
    said memory cells are arrayed at respective points of intersection between said word lines and said bit lines,
    the gate of each said variable threshold voltage transistor is connected to one of said work lines, the source thereof is connected to one of said bit lines and the drain thereof is connected to one electrode of said capacitor associated thereto, and
    the other electrode of said capacitor is connected to one of said control signal lines.

2. A nonvolatile semiconductor memory device in accordance with claim 1, wherein
    said row decoder selects any of said plurality of word lines to open the associated ones of said variable threshold voltage transistors connected to said selected word line, and
    said column decoder selects any of said plurality of bit lines to write or read data in or from said eapacitor through the opened variable threshold voltage transistors connected to said selected bit line.

3. A nonvolatile semiconductor memory device in accordance with claim 2, wherein
    said control signal providing means provides a control signal to each said memory cell through said control signal lines so, that the electric charge stored in said capacitor of each said memory cell is stored in said variable threshold voltage transistor of each said memory cell.

4. A nonvolatile semiconductor memory device in accordance with claim 3, wherein
    said control signal providing means provides said control signal in response to an external signal, or detects the turning off of said power source and provides said control signal before said power source is completely turned off.

5. A nonvolatile semiconductor memory device in accordance with claim 4, wherein for reproduction of the data stored in a nonvolatile manner in said variable threshold voltage transistors, a voltage is applied to said word lines to cause only the variable threshold voltage transistors having a low threshold voltage to be turned on and the variable threshold voltage transistors having a high threshold voltage to be turned off and said capacitors of said memory cells are recharged through said bit lines.

6. A nonvolatile semiconductor memory device in accordance with claim 1, wherein
each said variable threshold voltage transistor is a MOS transistor having a floating gate.

7. A nonvolatile semiconductor memory device in accordance with claim 6, wherein
said MOS transistor includes an oxide film formed between the semiconductor substrate thereof and said floating gate, and
said oxide film is made thinner in a portion extending on a difusion region assigned to said drain than the other portion.

* * * * *

UNITED STATES PATENT AND TRADEMARK OFFICE
CERTIFICATE OF CORRECTION

PATENT NO. : 4,760,556

DATED : July 26, 1988

INVENTOR(S) : Mikio DEGUCHI et al.

It is certified that error appears in the above-identified patent and that said Letters Patent is hereby corrected as shown below:

Column 4, line 36, change "work" to --word--;

Column 4, line 49, change "eapacitor" to --capacitor--;

Signed and Sealed this
Eleventh Day of April, 1989

*Attest:*

DONALD J. QUIGG

*Attesting Officer*     *Commissioner of Patents and Trademarks*

UNITED STATES PATENT AND TRADEMARK OFFICE
CERTIFICATE OF CORRECTION

PATENT NO. : 4,760,556

DATED : July 26, 1988

INVENTOR(S) : Mikio DEGUCHI et al.

It is certified that error appears in the above-identified patent and that said Letters Patent is hereby corrected as shown below:

Column 6, line 9, change "difusion" to --diffusion--.

Signed and Sealed this

Tenth Day of October, 1989

Attest:

DONALD J. QUIGG

*Attesting Officer*                *Commissioner of Patents and Trademarks*